(12) United States Patent
Kim

(10) Patent No.: US 8,502,214 B2
(45) Date of Patent: Aug. 6, 2013

(54) ORGANIC LIGHT EMITTING DIODE DISPLAY

(75) Inventor: Hun-Tae Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/365,345

(22) Filed: Feb. 3, 2012

(65) Prior Publication Data

US 2012/0256203 A1 Oct. 11, 2012

(30) Foreign Application Priority Data

Apr. 11, 2011 (KR) .................. 10-2011-0033393

(51) Int. Cl.
*H01L 29/08* (2006.01)
(52) U.S. Cl.
USPC .......... 257/40; 257/88; 257/98; 257/E51.018; 257/E51.02; 313/504
(58) Field of Classification Search
CPC ................ G06F 1/1601; H01L 27/3276
USPC ............ 257/40, 88, 98, E51.018, E51.02; 313/504; 345/36, 39, 44–46
See application file for complete search history.

(56) References Cited

U.S. PATENT DOCUMENTS

| | | | | |
|---|---|---|---|---|
| 6,989,571 B2* | 1/2006 | Park et al. | ...... | 257/350 |
| 7,990,061 B2* | 8/2011 | Kim | ...... | 313/512 |
| 8,258,523 B2* | 9/2012 | Lee et al. | ...... | 257/91 |
| 2005/0139821 A1* | 6/2005 | Park | ...... | 257/40 |
| 2007/0177069 A1* | 8/2007 | Lee | ...... | 349/56 |
| 2008/0239637 A1* | 10/2008 | Sung et al. | ...... | 361/681 |
| 2012/0026074 A1* | 2/2012 | Lee et al. | ...... | 345/76 |
| 2012/0104420 A1* | 5/2012 | Lee et al. | ...... | 257/88 |

FOREIGN PATENT DOCUMENTS

| KR | 10-0503589 | 7/2005 |
|---|---|---|
| KR | 10-2006-0106089 | 10/2006 |
| KR | 10-2008-0042094 A | 5/2008 |

* cited by examiner

*Primary Examiner* — Jose R Diaz
(74) *Attorney, Agent, or Firm* — Lee & Morse, P.C.

(57) ABSTRACT

An organic light emitting diode display includes a substrate, a display portion on the substrate, and a sealing substrate fixed on the substrate and sealingly engaging the display portion. The sealing substrate is fixed by an adhesive layer that surrounds the display portion. The sealing substrate includes a composite member, at least one conductive portion, and an insulation sheet. The composite member includes a resin base layer and a plurality of carbon fibers. The at least one conductive portion extends over inner and outer sides of the composite member and penetrates the composite member. The at least one conductive portion includes a double-layered structure having a metal foil layer and a plating layer. The insulation sheet is on the outer side of the composite member and the insulation sheet covers the at least one conductive portion.

20 Claims, 12 Drawing Sheets

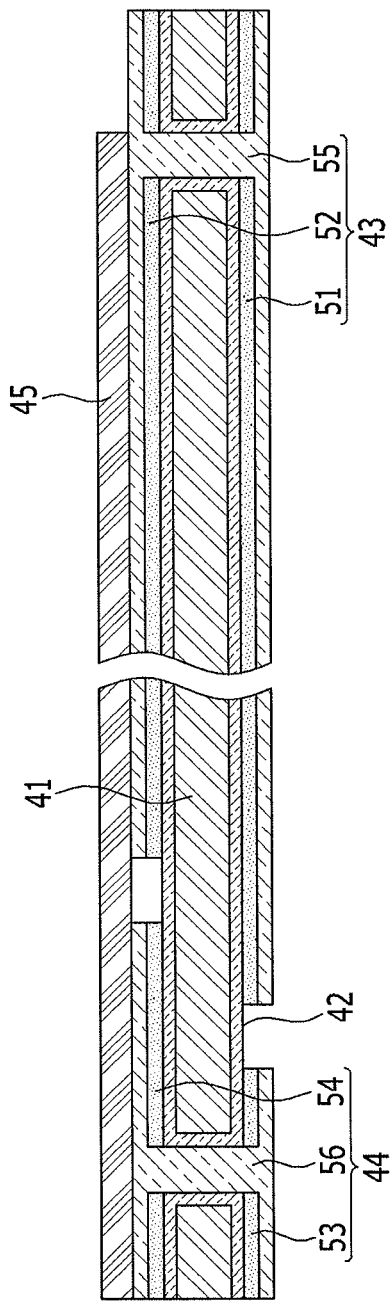

ORGANIC LIGHT EMITTING DIODE DISPLAY

RELATED APPLICATIONS

This application claims priority to and the benefit of Korean Patent Application No. 10-2011-0033393 filed in the Korean Intellectual Property Office on Apr. 11, 2011, the entire contents of which are incorporated herein by reference.

BACKGROUND

An organic light emitting diode (OLED) display is a self-emissive display that displays an image with a self-emissive organic light emitting element. The OLED display may be deteriorated in function when exposed to excessive moisture and oxygen.

SUMMARY

Embodiments may be realized by providing a substrate; a display portion formed on the substrate; and a sealing substrate fixed on the substrate by an adhesive layer that surrounds the display portion and sealing the display portion. The sealing substrate includes a composite member including a resin base layer and a plurality of carbon fibers; at least one conductive portion formed over inner and outer sides of the composite member while penetrating the composite member, and formed in a double-layered structure of a metal foil and a plating layer; and an insulation sheet covering the conductive portion at the outer side of the composite member.

An area of the conductive portion, disposed in the inner side of the composite and an area of the conductive portion, disposed in the outer side of the composite member may have the same thermal expansion coefficient.

The composite member may form a plurality of penetration holes, and the sealing substrate may further include insulation layers respectively formed in the inner and outer sides of the composite member and side walls of the respective penetration holes.

The metal foil may include a first metal foil attached on the insulation layer at the inner side of the composite member and a second metal foil attached on the insulation layer at the outer side of the composite member, and the first metal foil and the second metal foil may form openings exposing the penetration holes. The plating layers may be formed on the first and second metal foils while filling the penetration holes.

The first foil and the second foil may be made of the same metal, and the plating layer formed on the first metal foil and the plating layer formed on the second metal foil may be made of the same metal. The plating layer may include at least one of tin, copper, and aluminum.

The plurality of carbon fibers may be woven to be crossed with each other in the resin base layer. The composite member may be formed of a plurality of layers, and each of the plurality of layers may include a resin base layer and a plurality of carbon fibers arranged along one direction, and a plurality of carbon fibers arranged in one of the plurality of layers and a plurality of carbon fibers arranged in another layer of the plurality of layers cross each other.

Embodiments may also be realized by providing an OLED display that includes a substrate; a display portion formed on the substrate and including a common electrode and a common power line; and a sealing substrate fixed on the substrate by an adhesive layer that surrounds the display portion and sealing the display portion. The sealing substrate includes a composite member comprising a resin base layer and a plurality of carbon fibers; a first conductive portion formed over inner and outer sides of the composite member while penetrating the composite member, and connected with the common electrode to apply a first electric signal thereto; a second conductive portion formed over the inner and outer sides of the composite member while penetrating the composite member, and connected with the common power line to apply a second electric signal thereto; and Insulation sheets covering the first and second conductive portions at the outer side of the composite member. The first and second conductive portions are formed of a double-layered structure of a metal foil and a plating layer.

An area of the first conductive portion, disposed in the inner side of the composite member and an area of the second conductive portion, disposed in the outer side of the composite member may have the same thermal expansion coefficient.

The composite member may form a first penetration hole and a second penetration hole, and the sealing substrate may further include insulation layers respectively formed in the inner side of the composite member, the outside of the composite member, a side wall of the first penetration hole, and a side wall of the second penetration hole.

The first conductive portion may include a first metal foil attached on the insulation layer in the inner side of the composite member; a second metal foil attached on the insulation layer in the outer side of the composite member; and a first plating layer formed on the first and second metal foils while filling the first penetration hole.

The second conductive portion may include a third metal foil attached on the insulation layer in the inner side of the composite member while having a distance with the first metal foil; a third metal foil attached on the insulation layer in the inner side of the composite member while having a distance with the first metal foil; a second plating layer formed on the third and fourth metal foils while filling the second penetration hole.

The first, second, third, and fourth metal foils may be made of the same metal, and the first and second plating layers are made of the same metal.

The OLED display may further include a first pad portion disposed at an outer side of the display portion and connected with the common electrode; a second pad disposed at an outer side of the display portion while having a distance with the first pad and connected with the common power line; and conductive adhesive layers respectively disposed between the first pad portion and the first plating layer and between the second pad portion and the second plating layer.

The common power line may include a first common power line and a second common power line that cross each other, and the first pad portion and the second pad portion respectively disposed at four outer edges of the display portion.

The conductive adhesive layer may have conductivity along a thickness direction of the substrate, and may be insulative along other directions than the thickness direction. The conductive adhesive layer may be disposed to surround the display portion.

The first metal foil may include a center portion formed in a size that corresponds to the display portion and the adhesive layer; and a third pad portion connected with the center portion and disposed in a location where the first pad portion is disposed along a thickness direction of the substrate. The third metal foil may be provided in plural between the third pad portions, and disposed at the same location of the second pad portion along the thickness direction of the substrate.

BRIEF DESCRIPTION OF THE DRAWINGS

FIG. 3 is a partially enlarged cross-sectional view of a sealing substrate of the OLED display in FIG. 1.

DETAILED DESCRIPTION

Figure 1:
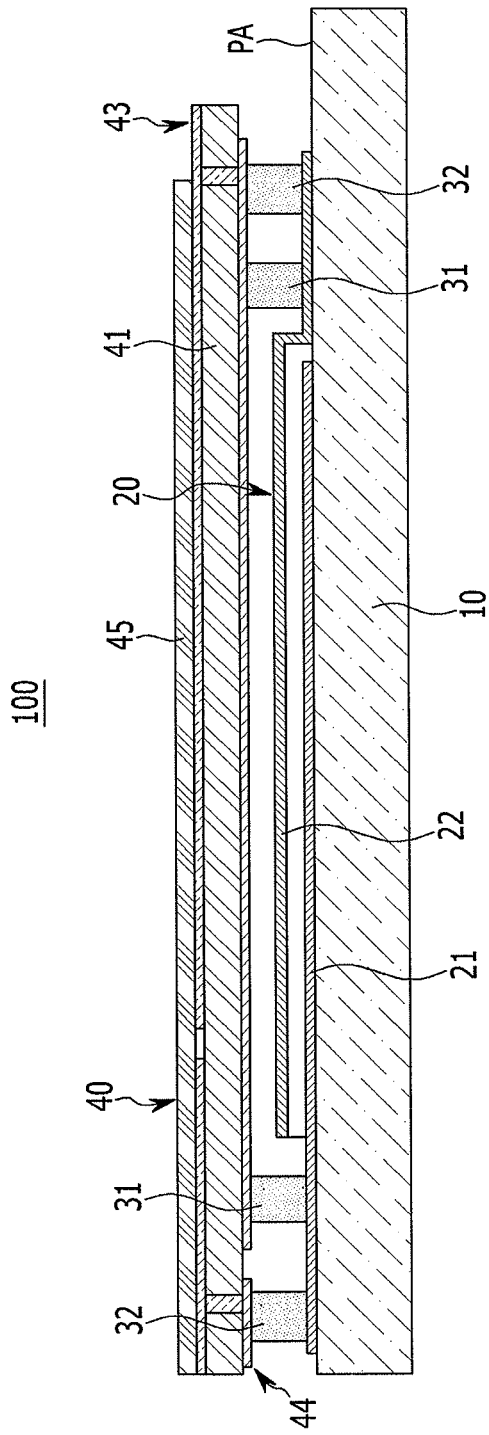
FIG. 1 is a cross-sectional view of an organic light emitting diode (OLED) display according to an exemplary embodiment.

Example embodiments will be described more fully hereinafter with reference to the accompanying drawings; however, as those skilled in the art would realize, the described embodiments may be modified in various different ways, all without departing from the spirit or scope of the present invention. Rather, these embodiments are provided so that this disclosure will be thorough and complete.

The drawings and description are to be regarded as illustrative in nature and not restrictive. Like reference numerals designate like elements throughout the specification. The size and thickness of the components shown the drawings are optionally determined for better understanding and ease of description, and the present invention is not limited to the examples shown in the drawings.

It will be understood that when an element such as a layer, film, region, or substrate is referred to as being "on" another element, it can be directly on the other element or intervening elements may also be present. Further, in the specification and the claims that follow, when it is described that an element is "coupled" to another element, the element may be "directly coupled" to the other element or "electrically coupled" to the other element through a third element.

FIG. 1 is a schematic cross-sectional view of an organic light emitting diode (OLED) display according to an exemplary embodiment.

Referring to FIG. 1, an OLED display 100 may include a substrate 10, a display portion 20 formed on the substrate 10, an adhesive layer 31, a conductive adhesive layer 32 surrounding the display portion 20, and a sealing substrate 40 fixed on the substrate 10 by the adhesive layer 31 and the conductive adhesive layer 32 while facing the display portion 20.

The display portion 20 may include a plurality of pixels. Each pixel may include a driving circuit and a light emitting element, e.g., an organic light emitting element, controlled by the driving circuit. The driving circuit may include, e.g., at least two thin film transistors including a switching thin film transistor and a driving thin film transistor and at least one capacitor. The organic light emitting element may include, e.g., a pixel electrode, an organic emission layer, and a common electrode.

One of the pixel electrode and the common electrode may be a hole injection electrode (anode) and the other may be an electron injection electrode (cathode). The pixel electrode may be formed in each pixel, and the pixel electrode may be connected with a driving thin film transistor of the corresponding pixel. Meanwhile, the common electrode may be formed commonly throughout the plurality of pixels.

Gate lines, data lines, and common power lines may be formed in each pixel of the display portion 20. The gate line may transmit a scan signal. The data line may transmit a data signal. The common power line may apply a common voltage to the driving thin film transistor. The common power line may include a first common power line and a second common power line that may be arranged such that they cross each other, e.g., the first and second common power lines may be arranged in directions that perpendicularly intersect each other.

The substrate 10 may be formed of, e.g., transparent glass or a transparent polymer film. Light emitted from the display portion 20 may be passed through the substrate 10 and then emitted to the outside. FIG. 1 schematically illustrates that the display portion 20 may be formed of at least three layers including, e.g., a common power line 21 and a common electrode 22. The structure of the display portion 20 will be described in further detail later.

The conductive adhesive layer 32 may be disposed at an external side of the adhesive layer 31, e.g., the conductive adhesive layer 32 may be disposed further away from the display portion 20 than the adhesive layer 31. The adhesive layer 31 and the conductive adhesive layer 32 may surround the display portion 20. The adhesive layer 31 and the conductive adhesive layer 32 may include an ultraviolet (UV) curable resin or a thermosetting resin, e.g., may include an epoxy resin. A getter layer (not shown) may be disposed between the display portion 20 and the adhesive layer 31. A moisture filler (not shown) may be disposed between the substrate 10 and the sealing substrate 40 at an inner side of the adhesive layer 31.

Figure 2:
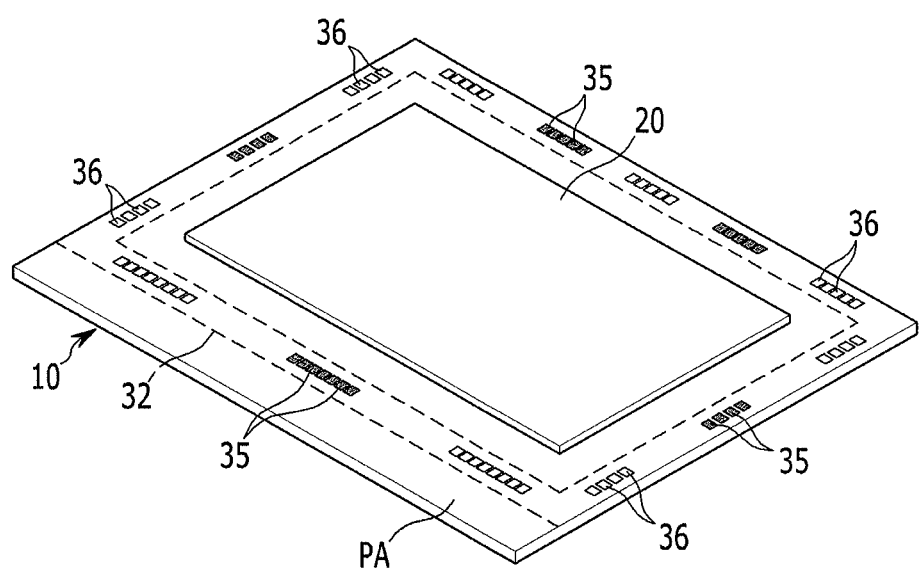
FIG. 2 is a schematic perspective view of a substrate of the OLED display in FIG. 1.

FIG. 2 is a schematic perspective view of the substrate in the OLED display of FIG. 1.

Referring to FIG. 1 and FIG. 2, a plurality of first pad portions 35 and a plurality of second pad portions 36 may be disposed on the substrate 10 at an external side of the adhesive layer 31, e.g., the first and second pad portions 35 and 36 may be further away from the display portion 20 than the adhesive layer 31. The first pad portion 35 may be connected with the common electrode 22 of the display portion 20. The second pad portion 36 may be connected with the common power line 21 of the display portion 20. The first pad portions 35 and the second pad portions 36 may be formed at external sides of four edges of the display portion 20 while being spaced apart from each other by a distance. The locations of the first and second pad portions 35 and 36 may be the same as that of the conductive adhesive layer 32. In FIG. 2, the location of the conductive adhesive layer 32 is marked by the dotted lines.

The conductive adhesive layer 32 may have conductivity along a thickness direction, e.g., a vertical direction in FIG. 1, of the substrate 10. The conductive adhesive layer 32 may be insulative along other directions excluding the thickness direction. Thus, although one conductive adhesive layer 32 contacts both of the first pad portion 35 and the second pad portion 36, the first pad portion 35 and the second pad portion 36 may not be electrically connected with each other through the conductive adhesive layer 32.

A pad area PA may be formed in the outside of the conductive adhesive layer 32 at one edge of the substrate 10, e.g., as illustrated in FIG. 2. Pad electrodes (not shown) that extend from several electrodes of the display portion 20 may be disposed in the pad area PA. The pad electrodes may be connected with, e.g., a chip-on film (not shown). A printed circuit board (PCB) that may be mounted on the pad area PA and may receive electric signals therefrom.

In FIG. 2, the first pad portions 35 are dot-patterned in order to distinguish the first pad portions 35 and the second pad portions 36. FIG. 2 schematically illustrates the first pad portions 35 and the second pad portions 36, according to an exemplary embodiment, and the number of the first and second portions 35 and 36 and the locations thereof are not limited thereto. A connection structure of the first pad portion 35 and the common electrode 22 and a connection structure of the second pad portion 36 and the common power line 21 will be described later.

Referring to FIG. 1, the sealing substrate 40 may be fixed on the adhesive layer 31 and the conductive adhesive layer 32 to seal the display portion 20. The sealing substrate 40 may cover the substrate 10, excluding the pad area PA. The sealing substrate 40 may include a first conductive portion 43, e.g., that supplies a first electric signal to the common electrode 22, and a second conductive portion 44, e.g., that supplies a second electric signal to the common power line 21.

FIG. 3 is a partially enlarged cross-sectional view of the sealing substrate in the OLED display of FIG. 1.

Referring to FIG. 3, the sealing substrate 40 may include a composite member 41 that includes, e.g., a resin base layer and a plurality of carbon fibers, an insulating layer 42 formed on the composite member 41, first and second conductive portions 43 and 44 formed on the insulating layer 42, and an insulation sheet 45 covering the first and second conductive portions 43 and 44 at an external side of the composite member 41. The first and second conductive portions 43 and 44 may extend from an internal side of the composite member 41 to the external side of the composite member 41.

Figure 4A:
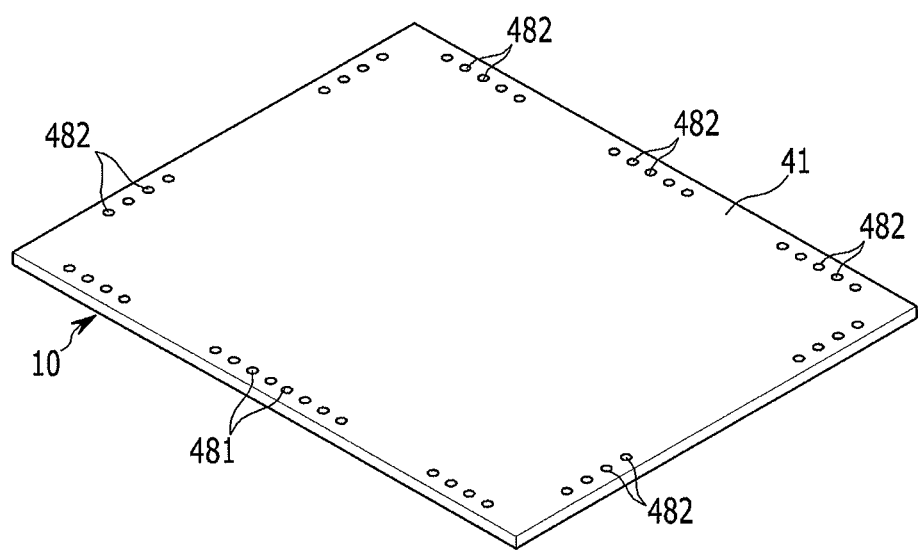
FIG. 4A is a schematic perspective view of a composite member of the sealing substrate in FIG. 3.
Figure 4B:
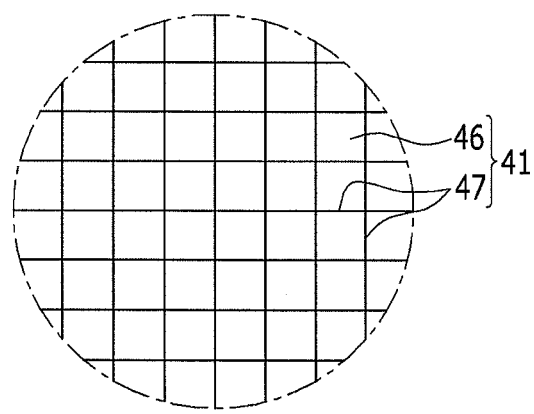
FIG. 4B is a partially enlarged top plan view of the composite member of FIG. 4A.

FIG. 4A is a schematic perspective view of the composite member of the sealing substrate of FIG. 3, and FIG. 4B is a partially enlarged schematic top plan view of the composite member of FIG. 4A.

Referring to FIG. 4A and FIG. 4B, the composite member 41 may be formed with a constant thickness. A plurality of penetration holes may be formed in the composite member 41, e.g., as illustrated in FIG. 4A. The penetration holes may include first penetration holes 481 and second penetration holes 482.

The composite member 41 may have a structure in which the plurality of carbon fibers 47 are embedded in the resin base layer 46, e.g., as illustrated in FIG. 4B. The carbon fibers 47 may not absorb moisture, thus waterproof ability of the composite member 41 may be increased. The composite member 41 including the carbon fibers 47 may have an excellent mechanical property so that the stiffness of the composite member 41 may be sufficiently strong even though the composite member 41 may only have a thickness of about 1 mm.

The plurality of carbon fibers 47 may be arranged to cross each other, e.g., may be woven with wefts and wraps. FIG. 4B illustrates that the carbon fibers 47 perpendicularly cross each other, but embodiments are not limited thereto. The carbon fibers 47 may cross each other at predetermined angles other than right angles.

Figure 4C:
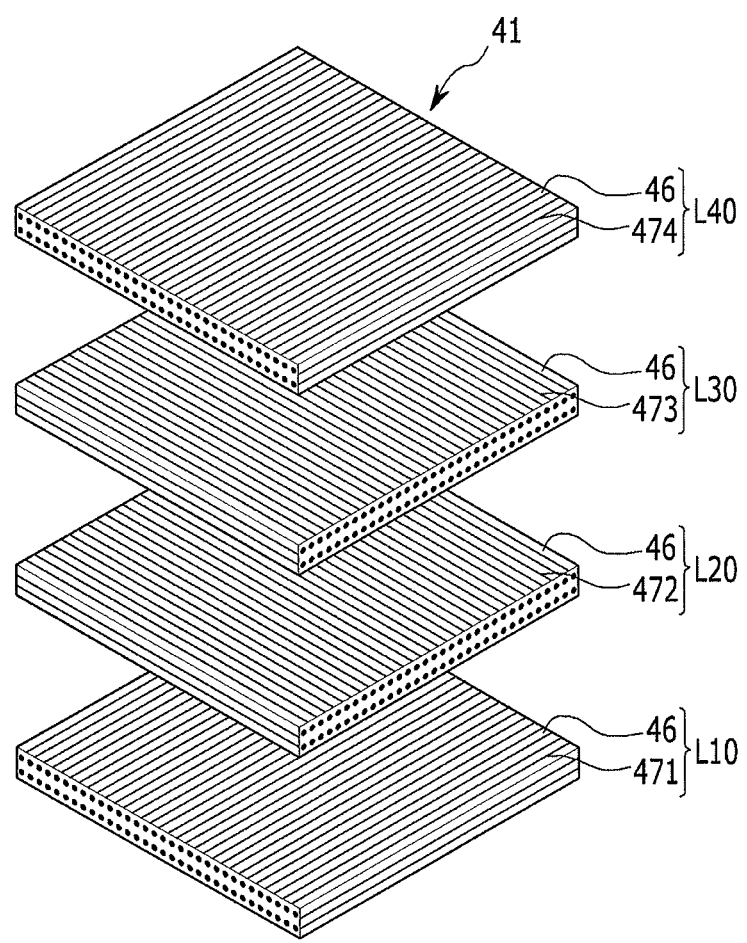
FIG. 4C is partially enlarged exploded perspective view of an exemplary variation of the composite member of FIG. 4B.

FIG. 4C is a partially enlarged exploded perspective view of the composite member of FIG. 4A, as an exemplary variation of FIG. 4B.

Referring to FIG. 4C, the composite member 41 may include a plurality of layers, e.g., a first layer L10, a second layer L20, a third layer L30, and a fourth layer L40. Each of the layers L10, L20, L30, and L40 may include a resin base layer 46 and a plurality of carbon fibers 471 472, 473, and 474, respectively. In each of the layers L10, L20, L30, and L40 the carbon fibers 471, 472, 473, and 474, respectively, may be arranged along one direction in the resin base layer 46. Carbon fibers arranged in one layer of the plurality of layers and carbon fibers arranged in another layer along the plurality of layers may be arranged such that the extending directions cross each other.

For example, the carbon fibers 471 of the first layer L10 and the carbon fibers 474 of the fourth layer L40 may be arranged along a first direction, and the carbon fibers 472 of the second layer L20 and the carbon fibers 473 of the third layer L30 may be arranged along a second direction. The first direction and the second direction may intersect each other, e.g., may be perpendicular with each other or may not be perpendicular with each other. FIG. 4C illustrates an exemplary embodiment in which the first direction and the second direction are perpendicular with each other.

When the plurality of carbon fibers 471, 472, 473, and 474 are arranged as described above, a horizontal direction thermal expansion coefficient and a vertical direction thermal expansion coefficient of the composite member 41 may become equivalent to each other so that the possibility of bending of the composite member 41, which that may occur during a thermal treatment process, may be reduced and/or bending may be prevented. The heat treatment process may include a thermal curing process of the resin base layer 46 and/or a process for thermal curing of the adhesive layer 31 and the conductive adhesive layer 32 for adhesion between the substrate 10 and the sealing substrate 40.

The thermal expansion coefficient of the composite member 41 may be equal to or similar to that of the substrate 10. The substrate 10 should experience several heat treatment processes to form the driving circuit and the organic light emitting element. Therefore, according to an exemplary embodiment, the substrate 10 may be made of glass or plastic having a low thermal expansion coefficient. For example, when the substrate 10 is made of glass, the thermal expansion coefficient of the substrate 10 may be about $3 \times 10^{-6}$K to $4 \times 10^{-6}$K.

In the composite member 41, the thermal expansion coefficient of the carbon fibers 47 may be lower than that of the substrate 10, and the thermal expansion coefficient of the resin base layer 46 may be higher than that of the substrate 10. In particular, the thermal expansion coefficient of the carbon fibers 47 may have a negative (−) value along a length direction thereof. The thermal expansion coefficient of the composite member 41 may be set to equivalent to or similar to that of the substrate 10 by, e.g., controlling the content of the resin base layer 46 and the content of the carbon fibers 47.

When the substrate 10 and the sealing substrate 40 are adhered to each other by thermally curing the adhesive layer 31 and the conductive adhesive layer 32, the bending problem may not occur. For example, the bending problem due to the thermal expansion coefficient differences between the substrate 10 and the sealing substrate 40 may not occur. The bending problem may not occur in the environment reliability test after the adhesion.

The plurality of penetration holes may be formed in the composite member 41, e.g., as illustrated in FIG. 4A. The penetration holes may include the first penetration holes 481 for the first conductive portion 43 illustrated in FIG. 3, and the second penetration hole 482 for the second conductive portion 44 illustrated in FIG. 3. The first penetration holes 481 and the second penetration holes 482 may be disposed along the edges of the composite member 41.

The composite member 41 including the carbon fibers may have conductivity. Therefore, when the first conductive portion 43 and the second conductive portion 44 are directly formed on the composite member 41, the first conductive portion 43 and the second conductive portion 44 may be electrically connected by the composite member 41. Thus, the insulation layer 42 may be formed at the surface of the composite member 41 to insulate the first conductive portion 43 and the second conductive portion 44 from each other, e.g., as illustrated in FIG. 3. The insulation layer 42 may be formed at an inner side of the composite member 41, a side wall of the first penetration hole 481, and a side wall of the second penetration hole 482. The inner side of the composite member 41 may refer to a plane disposed facing the display portion 20.

The first conductive portion 43 and the second conductive portion 44 may pass through the composite member 41. The first conductive portion 43 may be formed over the inner and outer sides of the composite member 41, which parts may be connected by a part of the first conductive portion 43 passing through the composite member 41. For example, the first conductive portion 43 may extend between the inner and outer sides of the composite member 41. Further, the first conductive portion 43 and the second conductive portion 44 may be formed by layering, e.g., metal foil and a plating layer.

Figure 5:
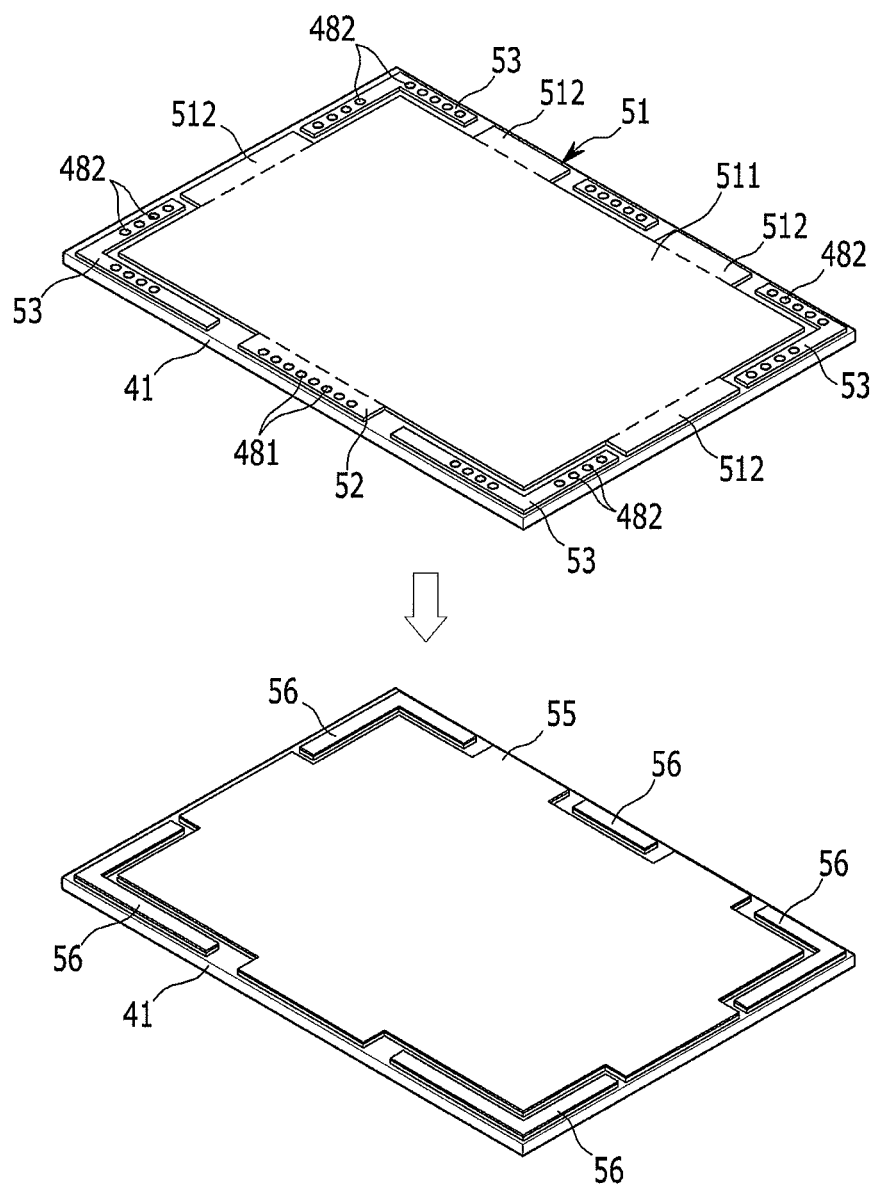
FIG. 5 and FIG. 6 are schematic perspective views of a first conductive portion and a second conductive portion of the sealing substrate of FIG. 3.
Figure 6:
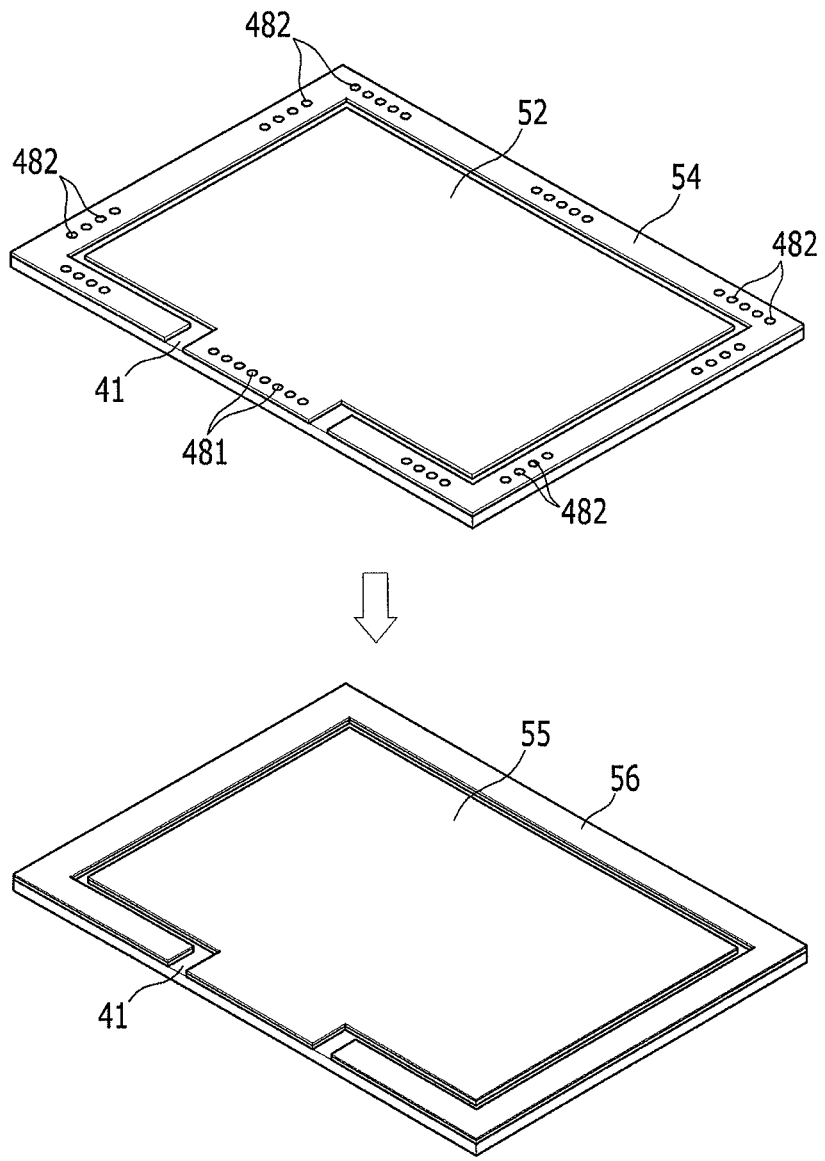

FIG. 5 and FIG. 6 are schematic perspective views of the first and second conductive portions in the sealing substrate of FIG. 3. FIG. 5 illustrates an inner side of the sealing substrate and FIG. 6 illustrates an outer side of the sealing substrate. In FIG. 5 and FIG. 6, the insulation layer is ease of explanation.

Referring to FIG. 3, FIG. 5, and FIG. 6, the first conductive portion 43 may include a first metal foil 51 disposed in the inner side of the composite member 41, a second metal foil 52 disposed in the outer side of the composite member 41, and a first plating layer 55 formed on the first and second metal foils 51 and 53 while filling the first penetration hole 481. The first metal foil 51 and the second metal foil 52 may be, e.g., copper (Cu) foils. The first plating layer 55 may include, e.g., at least one of tin (Sn), copper (Cu), and aluminum (Al).

The first metal foil 51 may include a center portion 551 formed in a size that corresponds to the display portion 20 and the adhesive layer 31, e.g., as illustrated in FIG. 5. The first metal foil 51 may include a plurality of third pad portions 512 arranged with a distance from each other along the edge of the center portion 511. The third pad portions may be disposed at the same location of the first pad portion 35, e.g., having the arranged as illustrated in FIG. 2, on the substrate 10. The second metal foil 52 may partially contact the edge of the composite member 41, and portions of the second metal foil 52 that do not contact the edge of the composite member 41 may be disposed at the center portion of the composite member 41, e.g., as illustrated in FIG. 6. The shape of the second metal foil 52 may be variously modified.

The first penetration hole 481 may be disposed at a portion where the first metal foil 51 and the second metal foil 52 are overlapped with each other. The first metal foil 51 and the second metal foil 52 may not fill the first penetration hole 481. That is, the first metal foil 51 and the second metal foil 52 may form an opening to expose the first penetration hole 481. The first plating layer 55 may be formed on the first and second metal foils 51 and 52 while filling the first penetration holes 481. Thus, the first metal foil 51 and the second metal foil 52 may be electrically connected.

In the above-stated structure of the first conductive portion 43, the first metal foil 51 and the second metal foil 52 may be electrically connected, e.g., easily electrically connected, and a manufacturing process thereof can be simplified. That is, pre-cut first and second metal foils 51 and 52 may be attached on the insulation layer 42 and metal is plated on the first metal foil 51 and the second metal foil 52 such that the first conductive portion 43 can be easily manufactured.

The second conductive portion 44 may include a third metal foil 43 disposed in the inner side of the composite member 41, a fourth metal foil 54 disposed in the outer side of the composite member 41, and a second plating layer 56 formed on the third and fourth metal foils 53 and 54 while filling a second penetration hole 482. The third metal foil 53 and the fourth metal foil 54 may be, e.g., copper (Cu) foils, and the second plating layer 56 may include, e.g., at least one of tin, copper, and aluminum.

The third metal foil 53 may be provided in plural, e.g., as illustrated in FIG. 5. The plural third metal foil 53 may be spaced apart, e.g., arranged distanced from the first metal foil 51 between the third pad portions 512 of the first metal foil 51. The third metal foil 53 may be formed at the same location of the second pad portion 36, e.g., refer to FIG. 2, on the substrate 10. The fourth metal foil 54 may be formed along the edge of the composite member 41 while surrounding the second metal foil 52. The shape of the fourth metal foil 54 may be variously modified.

The second penetration hole 482 may be arranged at a portion where the third metal foil 53 and the fourth metal foil 54 are overlapped with each other. The third metal foil 53 and the fourth metal foil 54 may not fill the second penetration hole 482. That is, the third metal foil 53 and the fourth metal foil 54 may form an opening to expose the second penetration hole 482. While filling the second penetration hole 482, a second plating layer 56 may be formed on the third metal foil 53 and the fourth metal foil 54 such that the third metal foil 53 and the fourth metal foil 54 are electrically connected with each other.

In the above-stated structure of the second conductive portion 44, the third metal foil 53 and the fourth metal foil 54 may be electrically connected, e.g., easily electrically connected, and a manufacturing process may be simplified. That is, pre-cut third and fourth metal foils 53 and 54 may be attached on the insulation layer 42 and metals may be plated on the third and fourth metal foils 53 and 54 such that the second conductive portion 44 can be simply manufactured.

The first metal foil 51, the second metal foil 52, the third metal foil 53, and the fourth metal foil 54 may be formed of the same metal, according to an exemplary embodiment. The first plating layer 55 and the second plating layer 56 may be formed of the same metal, according to an exemplary embodiment. The first and second conductive portions 43 and 44 may control the thermal expansion coefficient of the area in the inner side of the composite member 41, e.g., to be substantially equivalent to that of the area in the outer side of the composite member 41 so that the possibility of bending, which may occur during the heat treatment process due to a thermal expansion coefficient difference between the two areas, may be reduced and/or bending may be prevented.

Figure 7:
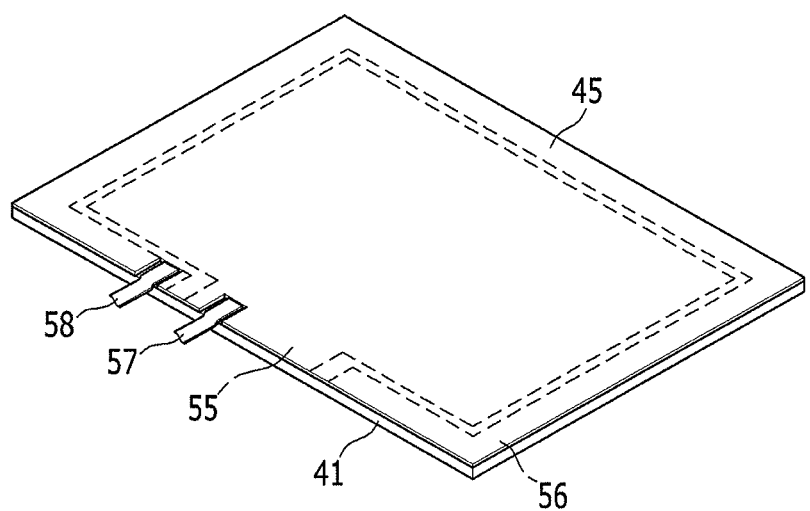
FIG. 7 is a schematic perspective view of an external surface of the sealing substrate of FIG. 3.

FIG. 7 is a schematic perspective view of an outer side of the sealing substrate shown in FIG. 3.

Referring to FIG. 3 and FIG. 7, the insulation sheet 45 may be attached on the first plating layer 55 and the second plating layer 56 at the outer side of the composite member 41. A first external access terminal 57 may be attached to the first plating layer 55 at the outer side of the composite member 41, e.g., to apply a first electric signal for the common electrode 22 to the first plating layer 55. A second external access terminal 58 may be attached to the second plating layer 56 at the outer side of the composite member 41, e.g., to apply a second electric signal for the common power line 21 to the second plating layer 56.

The insulation sheet 45 may be attached to the outer side, e.g., the entire outer side, of the composite member 41. According to an exemplary embodiment, the insulation sheet 45 may be excluded in a portion where the first and second external access terminals 57 and 58 are attached so as to cover the first and second plating layers 55 and 56 to which the electric signals flow for protection.

Referring to FIG. 3, in the above-stated structure of the sealing substrate 40, the sealing substrate 40 may reduce the possibility of and/or prevent bending (curling) by the insulation sheet 45, the first plating layer 55, and the second plating layer 56.

When a polymer resin is coated onto the outer side of the composite member 45, e.g., to cover the first and second conductive portions 43 and 44 instead of using the insulation sheet 45, the sealing substrate 40 may be bent. The bending may be due to a thermal expansion coefficient difference between the polymer resin and the composite member 41 during a process for thermally curing the polymer and a process for adhering the substrate 10 and the sealing substrate 40 by thermally curing the adhesive layer 31.

However, embodiments, e.g., the exemplary embodiment discussed above, the thermal expansion coefficient of the outer side structure of the composite member 41 and the thermal expansion coefficient of the inner side structure of the composite member 41 may be controlled to be substantially equivalent to each other by, e.g., attaching the insulation sheet 45 instead of using the polymer resin and using the first and second plating layers 55 and 56 so that the possibility of bending of the sealing substrate 40, which may occur during the heat treatment process for sealing the substrate 10 and the sealing substrate 40 to each other, may be reduced and/or bending may be prevented. Thus, the OLED display 100, according to exemplary embodiments, may easily improve flatness of the sealing substrate 40 while reducing the thickness thereof.

Referring to FIG. 1 to FIG. 3, in the first conductive portion 43, the first plating layer 55 on the third pad portion 512 may be attached to the conductive adhesive layer 32 and connected to the common electrode 22 of the display portion 20 through the first pad portion 35. In the second conductive portion 44, the second plating layer 56 on the third plating layer 53 may be attached to the conductive adhesive layer 32 and connected to the common power line 21 of the display portion 20 through the second pad portion 36. Thus, the first conductive portion 43 may apply the first electric signal to the common electrode 22 and the second conductive portion 44 may apply the second electric signal to the common power line 21.

In this case, since the first and second pad portions 35 and 36 may be respectively provided at four external edges (up, down, left, and right) of the display portion 20, the first and second electric signals may be uniformly applied to the common electrode 22 and the common power line 21 of the display portion 20.

In an OLED display, luminance uniformity of the screen may be deteriorated due to wiring resistance as the size of the display portion 20 is increased. Therefore, pad areas PA may be formed at four edges (up, down, left, and right) of the substrate 10 so as to reduce the possibility of and/or prevent the deterioration of the luminance uniformity. However, according to exemplary embodiments, the luminance uniformity of the screen may be improved, e.g., guaranteed, by forming the pad area PA at one edge of the substrate 10. Accordingly, the entire structure and manufacturing process of the OLED display 100 may be simplified while reducing the possibility of and/or preventing luminance non-uniformity in manufacturing of a large-sized display portion 20.

Since the first and second conductive portions 43 and 44 of the sealing substrate 40 may be made of metal, penetration of external moisture and oxygen may reduced and/or excellently prevented. Further, the first metal foil 51 and the first plating layer 55 above the first metal foil 51 may be large enough to cover the display portion 20 and the adhesive layer 31 so that they function as a metal sealing layer that seals the display portion 20. Thus, the external moisture and oxygen of the OLED display 100 may be blocked through several steps by the first conductive portion 43, the second conductive portion 44, and composite member 41, and the sealing substrate 40 may improve an air-tightness property like a glass substrate.

As a result, the OLED display 100, according to exemplary embodiments, may improve the display quality and life-span characteristic of the display portion 20, reduce the thickness of the sealing substrate 40, and assure high flatness of the sealing substrate 40 such that the OLED display 100 may be made ultra slim with ease.

Figure 8:
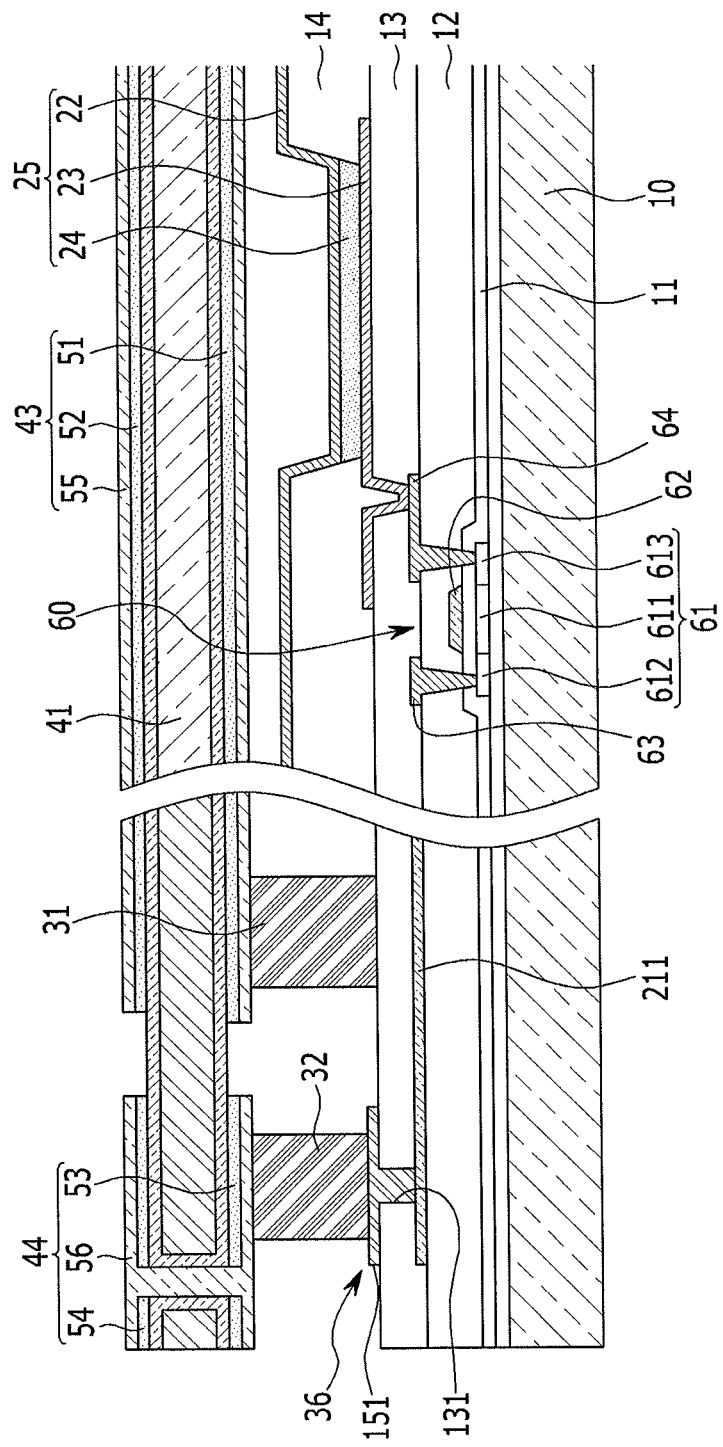
FIG. 8 to FIG. 10 are partially enlarged cross-sectional views of the OLED display of FIG. 1.
Figure 9:
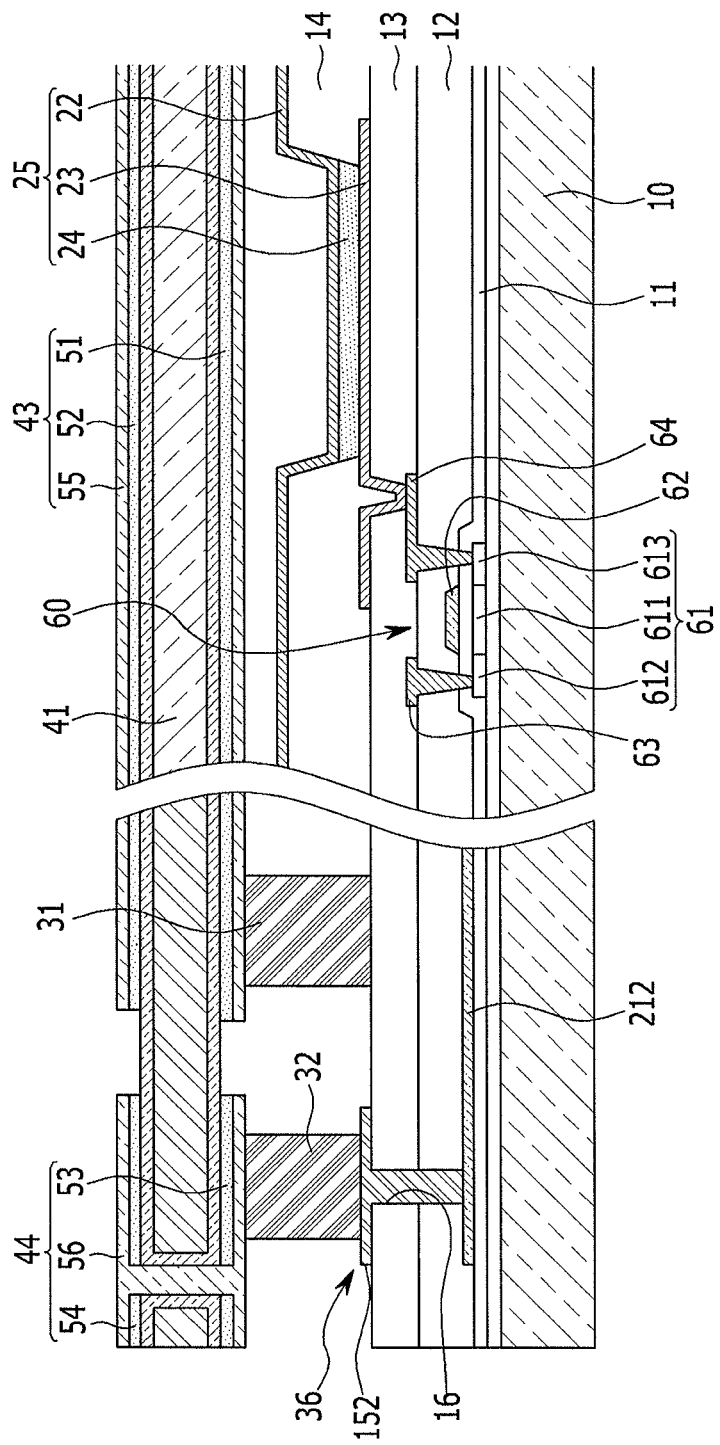
Figure 10:
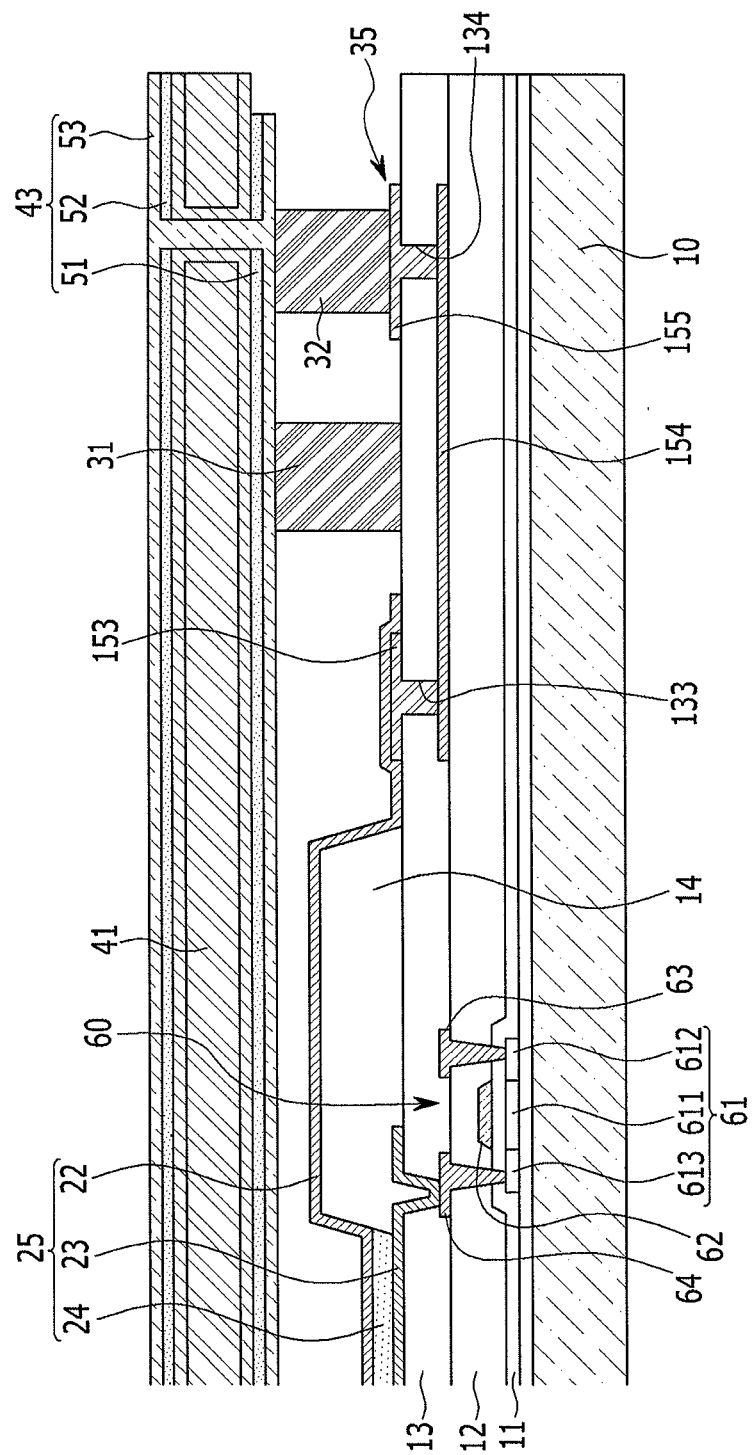

FIG. 8 to FIG. 10 are partially enlarged cross-sectional views of the OLED display of FIG. 1. FIG. 8 illustrates the first common power line 211 and the second pad portion 36 in further detail, and FIG. 9 illustrates the second common power line 212 and the second pad portion 36 in further detail. FIG. 10 illustrates the common electrode 22 and the first pad portion 35 in further detail.

Referring to FIG. 8 to FIG. 10, an organic light emitting element 25 and a driving circuit may be formed in each pixel of the display portion 20. The driving circuit may be formed of at least two thin film transistors and at least one capacitor. FIG. 8 to FIG. 10 respectively illustrate that one thin film transistor 60 and one organic light emitting element 25 may be formed in the display portion 20.

The thin film transistor 60 may include a semiconductor layer 61, a gate electrode 62, a source electrode 63, and a drain electrode 64. The semiconductor layer 61 may be formed with a polycrystalline silicon layer, and may include a channel area 611, a source area 612, and a drain area 613. The channel area 611 may be an intrinsic semiconductor in which impurities are not doped therein. The source area 612 and the drain area 613 may be impurity semiconductors in which impurities are doped therein.

The gate electrode 62 may be disposed on the channel area 611 of the semiconductor layer 61, and a gate insulating layer 11 may be interposed therebetween. The source electrode 63 and the drain electrode 64 may be disposed on the gate electrode 62, and an interlayer insulating layer 12 may be interposed therebetween. The source electrode 63 and the drain electrode 64 may be connected with the source area 612 and the drain area 613, respectively, through a contact hole formed in the interlayer insulating layer 12. A planarization layer 13 may be formed on the source electrode 63 and the drain electrode 64, and a pixel electrode 23 may be disposed on the planarization layer 13. The pixel electrode 23 may be connected with the drain electrode 64 through a contact hole of the planarization layer 13.

A pixel definition layer 14 may be disposed on the pixel electrode 23 and the planarization layer 13. The pixel definition layer 14 may form an opening in each pixel to partially expose the pixel electrode 23. An organic emission layer 24 may be formed over the exposed pixel electrode 23, and the common electrode 22 may be formed throughout the display portion 20 to cover the organic emission layer 24 and the organic emission layer 24. The pixel electrode 23, the organic emission layer 24, and the common electrode 22 form the organic light emitting element 25.

The pixel electrode 23 may be a hole injection electrode and the common electrode 22 may be an electron injection electrode. In this case, the organic emission layer 24 may be formed of a hole injection layer (HIL), a hole transport layer (HTL), an emission layer, an electron transport layer (ETL), and an electron injection layer (EIL) that are sequentially layered. Holes and electrons are injected to the organic emission layer 24 from the pixel electrode 23 and the common electrode 22, and emission of light may be made when the excitons being the combinations of the injected holes and electrodes drop from the excited state to the ground state.

The pixel electrode 23 may be formed as a transmissive conductive layer and the common electrode 22 may be formed as a reflective conductive layer. Light emitted from the organic emission layer 24 may be reflected by the common electrode 22 and emitted to the outside through the pixel electrode 23 and the substrate 10. Such a light emission structure may be called a bottom emission type. The pixel electrode 23 may be formed with a triple film of tin oxide (ITO)/silver (Ag)/ITO, and the common electrode 22 may include silver (Ag) or aluminum (Al).

A first common power line 211 and a second common power line 212 may be formed in the same layer where one of the gate electrode 62 and source/drain electrodes 63 and 64 is formed. FIG. 8 illustrates that the first common power line 211 and the source/drain electrodes 63 and 64 may be formed in the same layer with the same material, and FIG. 9 illustrates that the second common power line 212 and the gate electrode 62 may be formed in the same layer with the same material.

Referring to FIG. 8 and FIG. 9, each end portion of the first and second common power lines 211 and 212 may extend to the external side of the display portion 20. In addition, at least one of the four insulation layers formed in the display portion 20 may extend to the external side of the display portion 20. For example, the end portion of the first common power line 211 may be covered by the planarization layer 13 and the end portion of the second common power line 212 may be covered by the interlayer insulating layer 12 and the planarization layer 13.

The planarization layer 13 may expose the end portion of the first common power line 211 by forming a first opening 131, e.g., as illustrated in FIG. 8. A first pad conductive layer 151 may be formed on the planarization layer 13 so as to be electrically connected with the first common power line 211 through the first opening 131. A second pad portion 36 disposed at a long side of the substrate 10 may be defined as the first pad conductive layer 151.

Referring to FIG. 9, the interlayer insulating layer 12 and the planarization layer 13 may expose the end portion of the second common power line 212, e.g., by forming a second opening 16. A second pad conductive layer 152 may be formed on the planarization layer 13 so as to be electrically connected with the second common power line 212 through the second opening 16. A second pad portion 36 disposed at a short side of the substrate 10 may be defined as the second pad conductive layer 152. The first pad conductive layer 151 and the second pad conductive layer 152 may be formed with, e.g., the same material of the pixel electrode 23 and the same layer as the pixel electrode 23.

Referring to FIG. 10, the common electrode 22 may be disposed at the inner side of the adhesive layer 31. The first pad portion 35 may be disposed over the inner and outer sides of the adhesive layer 32 such that the common electrode 22 and the conductive adhesive layer 32 may be conductive, e.g., electrically connected, to each other. For example, the first pad portion 35 may extend between the inner and outer sides of the adhesive layer 32. The first pad portion 35 may include a third pad conductive layer 153, a fourth pad conductive layer 154, and a fifth pad conductive layer 155.

The third pad conductive layer 153 may be disposed at the inner side of the adhesive layer 31 and may contact the common electrode 22. The fourth pad conductive layer 154 may be connected with the third pad conductive layer 153 through the third opening 133 of the planarization layer 13, and disposed over the inner and outer sides of the adhesive layer 31. For example, the fourth pad conductive layer 154 may extend between the inner and outer sides of the adhesive layer 31. The fifth pad conductive layer 155 may be disposed between the conductive adhesive layer 32 and the planarization layer 13, and may be connected with the fourth pad conductive layer 154 through a fourth opening 134 of the planarization layer 13.

The third pad conductive layer 153 and the fifth pad conductive layer 155 may be formed with the same material of the pixel electrode 23 and in the same layer where the pixel electrode 23 is formed. The fourth pad conductive layer 154 and one of the gate electrode 62 and source/drain electrodes 63 and 64 may be formed in the same layer and with the same material as the fourth pad conductive layer 154. FIG. 10 illustrates an exemplary embodiment in which the fourth pad conductive layer 154 and the source/drain electrodes 63 and 64 are formed in the same layer and with the same material.

The detailed structure of the first pad portion 35 and the second pad portion 36 are not limited to the above-stated description, and any structure in which the first and second pad portions 35 and 36 respectively connect the common electrode 22 and the conductive adhesive layer 32 and the common power line 21 and the conductive adhesive layer 32 may be applied.

By way of summation and review, a display unit that includes a plurality of organic light emitting elements may be deteriorated in function when exposed to moisture and oxygen. Therefore, a technology for reducing the possibility of and/or preventing external moisture and oxygen from permeating the display unit is sought. Furthermore, as the area of the OLED display increases, a thin sealing structure that can guarantee high flatness with a simple manufacturing process is sought.

Embodiments relate to an organic light emitting diode (OLED) display that includes a sealing structure for sealing a display portion. The described technology has been made in an effort to provide an OLED display that may improve display quality and a life-span of a display portion by enhancing a sealing performance of the display portion and may improve flatness of the display portion while reducing the thickness of a sealing structure. The OLED display may simplify the entire structure and manufacturing process. Further, the flatness of the display portion may be enhanced while reducing the thickness of the sealing substrate so that an ultra slim OLED display may be manufactured with ease.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display, comprising:
   a substrate;
   a display portion on the substrate; and
   a sealing substrate fixed on the substrate and sealingly engaging the display portion, the sealing substrate being fixed by an adhesive layer that surrounds the display portion, wherein the sealing substrate includes:
      a composite member, the composite member including a resin base layer and a plurality of carbon fibers;
      at least one conductive portion extending over inner and outer sides of the composite member and penetrating the composite member, the at least one conductive portion including a double-layered structure having a metal foil layer and a plating layer; and
      an insulation sheet on the outer side of the composite member, the insulation sheet covering the at least one conductive portion.

2. The OLED display of claim 1, wherein a first area of the conductive portion at the inner side of the composite member and a second area of the conductive portion at the outer side of the composite member have a same thermal expansion coefficient.

3. The OLED display of claim 1, wherein:
   the composite member includes a plurality of penetration holes, and
   the sealing substrate includes insulation layers at the inner and outer sides of the composite member and at side walls of the penetration holes.

4. The OLED display of claim 3, wherein the metal foil layer includes a first metal foil attached on the insulation layer at the inner side of the composite member and a second metal foil attached on the insulation layer at the outer side of the composite member, the first metal foil and the second metal foil having openings that expose the penetration holes.

5. The OLED display of claim 4, wherein the plating layers are on the first and second metal foils and fill the penetration holes.

6. The OLED display of claim 5, wherein the first metal foil and the second metal foil are made of a first same metal, and the plating layer on the first metal foil and the plating layer on the second metal foil are made of a second same metal.

7. The OLED display of claim 6, wherein the plating layer includes at least one of tin, copper, and aluminum.

8. The OLED display of claim 1, wherein each of the plurality of carbon fibers are woven to extend in one of a first direction and a second direction in the resin base layer, the first direction intersecting the second direction.

9. The OLED display of claim 1, wherein:
   the resin base layer of the composite member is one of a plurality of resin base layers and the composite member is formed of a plurality of composite layers,
   one of the plurality of composite layers includes one of the plurality of resin base layers and ones of the plurality of carbon fibers arranged along one direction, and
   another of the plurality of composite layers includes another of the plurality of resin base layers and others of the plurality of carbon fibers arranged in another direction, the one direction and the other direction intersecting each other.

10. An organic light emitting diode (OLED) display, comprising:
    a substrate;
    a display portion on the substrate, the display portion including a common electrode and a common power line; and
    a sealing substrate fixed on the substrate and sealingly engaging the display portion, the sealing substrate being fixed by an adhesive layer that surrounds the display portion, wherein the sealing substrate includes:
       a composite member, the composite member including a resin base layer and a plurality of carbon fibers;
       a first conductive portion extending over inner and outer sides of the composite member and penetrating the composite member, the first conductive portion being connected to the common electrode to supply a first electric signal;
       a second conductive portion extending over the inner and outer sides of the composite member and penetrating the composite member, the second conductive portion being connected to the common power line to supply a second electric signal, each of the first and second conductive portions having of a double-layered structure having a metal foil layer and a plating layer; and
       an insulation sheet on the outer side of the composite member, the insulation sheet covering the first and second conductive portions.

11. The OLED display of claim 10, wherein a first area of the first conductive portion at the inner side of the composite member and a second area of the second conductive portion at the outer side of the composite member have a same thermal expansion coefficient.

12. The OLED display of claim 10, wherein:
    the composite member includes a first penetration hole and a second penetration hole, and
    the sealing substrate includes insulation layers at the inner side of the composite member, at the outer side of the composite member, at a side wall of the first penetration hole, and at a side wall of the second penetration hole.

13. The OLED display of claim 12, wherein the first conductive portion includes:
    a first metal foil attached on the insulation layer at the inner side of the composite member;
    a second metal foil attached on the insulation layer at the outer side of the composite member; and
    a first plating layer on the first and second metal foils, the first plating layer filling the first penetration hole.

14. The OLED display of claim 13, wherein the second conductive portion includes:
    a third metal foil attached on the insulation layer at the inner side of the composite member, the third metal foil being spaced apart from the first metal foil;
    a fourth metal foil attached on the insulation layer at the outer side of the composite member, the fourth metal foil being spaced apart from the second metal foil; and
    a second plating layer on the third and fourth metal foils, the second plating layer filling the second penetration hole.

15. The OLED display of claim 14, wherein the first, the second, the third, and the fourth metal foils are made of a first same metal, and the first and second plating layers are made of a second same metal.

16. The OLED display of claim 14, further comprising:
    a first pad portion at an outer side of the display portion, the first pad portion being connected to the common electrode;
    a second pad at an outer side of the display portion, the second pad being spaced apart from the first pad and being connected to the common power line; and
    conductive adhesive layers between the first pad portion and the first plating layer and between the second pad portion and the second plating layer, respectively.

17. The OLED display of claim 16, wherein:
the common power line includes a first common power line and a second common power line, the first common power line intersecting the second common power line, and
the first pad portion and the second pad portion are at four outer edges of the display portion.

18. The OLED display of claim 16, wherein the conductive adhesive layer has conductivity along a thickness direction of the substrate, and is insulative along directions other than the thickness direction of the substrate.

19. The OLED display of claim 16, wherein the first metal foil includes:
a center portion having a size that corresponds to the display portion and the adhesive layer; and
at least one third pad portion connected with the center portion, the third pad portion being arranged in a location where the first pad portion is disposed along a thickness direction of the substrate.

20. The OLED display of claim 19, wherein the third metal foil is provided in plural between third pad portions, and the third metal foils are arranged at a same location as the second pad portion along a thickness direction of the substrate.

\* \* \* \* \*